United States Patent [19]

Jang

[11] Patent Number: 5,065,049

[45] Date of Patent: Nov. 12, 1991

[54] MOS DRIVER CIRCUIT HAVING CLAMP MEANS TO HOLD THE OUTPUT VOLTAGE CONSTANT REGARDLESS OF VARIATIONS IN THE OPERATING VOLTAGE

[75] Inventor: Hyeon-Sun Jang, Suwon, Rep. of Korea

[73] Assignee: Samsung Electronics Co., Ltd., Kyunggi, Rep. of Korea

[21] Appl. No.: 621,829

[22] Filed: Dec. 4, 1990

[30] Foreign Application Priority Data

Aug. 10, 1990 [KR] Rep. of Korea .................... 90-12348

[51] Int. Cl.$^5$ ............................................ H03K 17/16
[52] U.S. Cl. .................................... 307/443; 307/451; 307/475; 307/482
[58] Field of Search ............... 307/443, 451, 475, 482, 307/578, 542, 544

[56] References Cited

U.S. PATENT DOCUMENTS

| | | | |
|---|---|---|---|
| 4,678,944 | 7/1987 | Williams | 307/475 |
| 4,866,308 | 9/1989 | Cecchi et al. | 307/451 |
| 4,972,104 | 11/1990 | Estrada | 307/475 |
| 4,998,029 | 3/1991 | Sundstrom | 307/475 |

*Primary Examiner*—Stanley D. Miller
*Assistant Examiner*—Scott A. Ouellette

[57] ABSTRACT

A MOS driver circuit comprises a pull-up NMOS transistor, a pull-down NMOS transistor, and a clamper circuit. The pull-up NMOS transistor has a source connected to an output terminal and a gate connected to a boosting node supplied with a boosted voltage when the output terminal is driven to a "high" state. The pull-down NMOS transistor has a drain connected to the output terminal and a source connected to the ground voltage, and is turned on when the output terminal is driven to a "low" state. The clamper circuit clamps the boosted voltage to a predetermined voltage by opening a current path from the boosting node to the output node when the boosted voltage supplied to the boosting node is greater than the predetermined voltage. In the circuit, the noise in the power and ground lines, which is generated due to the variation of the output voltage caused by the variation of the supply voltage, is prevented. Also, since the clamper circuit of the present invention discharges the charge of the boosting node to the output terminal, more charge can be discharged within short time during the transition from a low output state to a high state, thereby resulting in a more effective clamping operation.

5 Claims, 4 Drawing Sheets

FIG.2A *(PRIOR ART)*
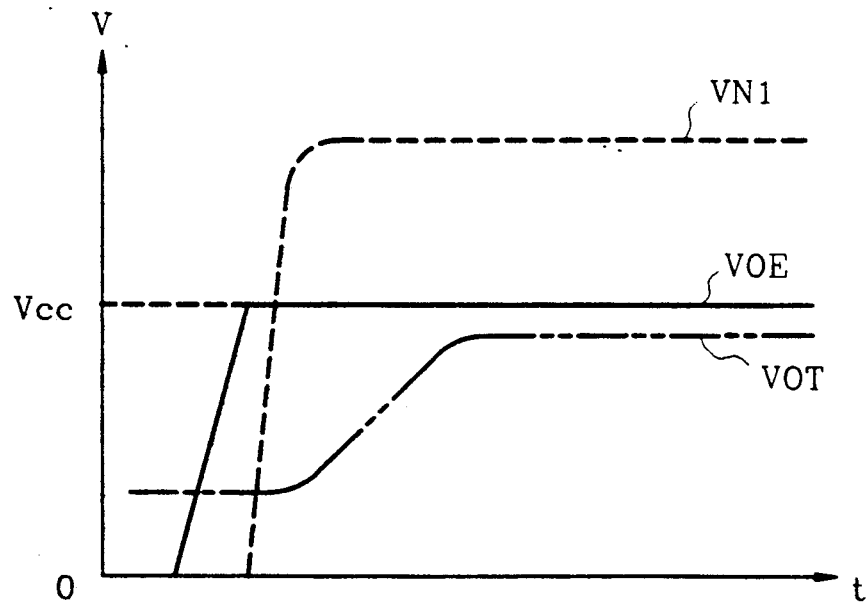
FIG.2B *(PRIOR ART)*
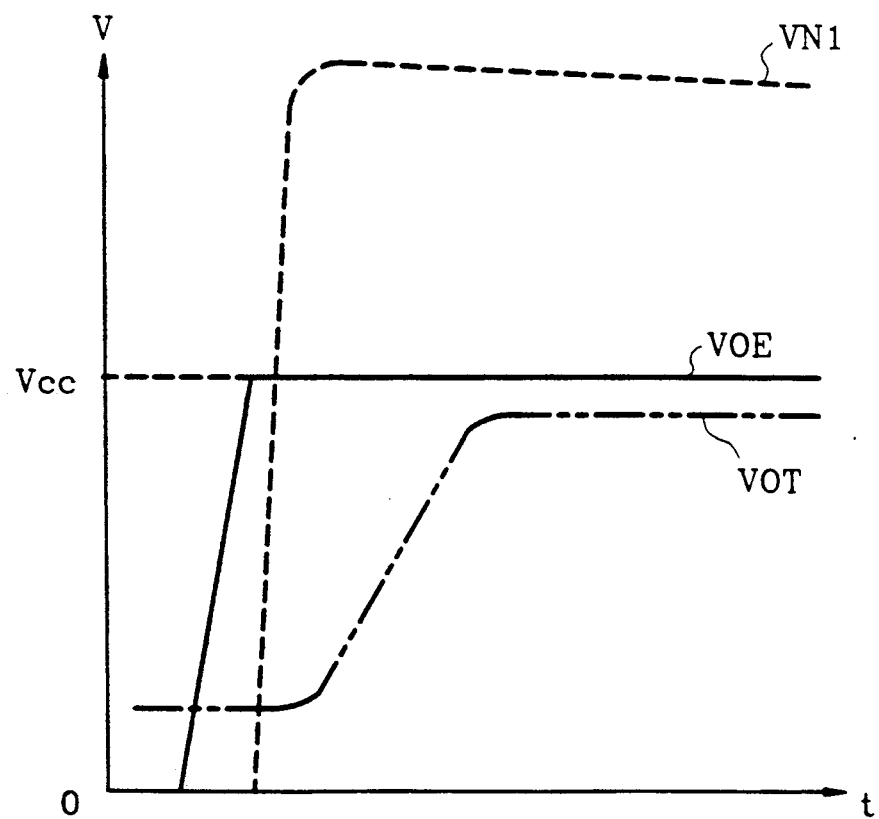

MOS DRIVER CIRCUIT HAVING CLAMP MEANS TO HOLD THE OUTPUT VOLTAGE CONSTANT REGARDLESS OF VARIATIONS IN THE OPERATING VOLTAGE

FIELD OF THE INVENTION

The present invention relates to a MOS driver circuit, and particularly, to a MOS driver circuit having a bootstrap capacitor.

BACKGROUND OF THE INVENTION

Generally, a MOS driver circuit drives a large current of hundreds of mA to an output terminal in response to an input signal. Accordingly, due to large driving current consumption, a push-pull output stage is conventionally included in a MOS driver circuit to reduce the power consumption. In the push-pull output stage, a pull-up NMOS transistor and a pull-down NMOS transistor are connected between a supply voltage Vcc and the ground voltage Vss, and the node connected commonly to the source of the pull-up NMOS transistor and the drain of the pull-down NMOS transistor is connected to an output terminal. In such a push-pull output stage of the NMOS transistors, the output voltage does not reach a full Vcc of potential difference when a "high" output is driven due to a voltage drop by the pull-up nmos transistor; rather the potential difference is Vcc−Vt because of the drop by a threshold voltage Vt. Thus, it is disadvantageous in that the operating speed is dropped when the capacitance load is driven.

To solve the above problem, there has been reported a driver circuit adopting a boost circuit which supplies Vcc potential difference to the output terminal by driving the pull-up NMOS transistor with a voltage boosted above Vcc. In general, a driver circuit adopting a boost circuit comprises a bootstrap capacitor, which is precharged, so as to drive the pull-up NMOS transistor with a potential of Vcc+α obtained by adding the precharging voltage α of the capacitor to the supply voltage Vcc. Accordingly, the pull-up NMOS transistor is completely turned on and a full Vcc potential difference is supplied to the output terminal.

However, the driver circuit as described above depends on the supply voltage Vcc. Accordingly, if the supply voltage Vcc varies, the output voltage also varies as much as the variation of the supply voltage. In particular, at a voltage higher than the normal supply voltage, for instance, at a high voltage Vcc of above 6 V with the normal supply voltage of 5 V, the parasitic reactance and the capacitance existing at output terminal results in noises on the ground line and the power line.

Under the circumstances, a technique is reported, in which at a high Vcc, the current supplied to the pull-up NMOS transistor is by-passed to the supply voltage line via the clamping circuit, so as to clamp the boosted voltage to Vcc+β ( here, β is a clamping voltage).

SUMMARY OF THE INVENTION

It is an object of the present invention to provide a MOS driver circuit which can keep a constant output voltage regardless of the variation of the supply voltage, thus obviating the problems encountered in the above conventional techniques.

It is another object of the present invention to provide a MOS driver circuit which can effectively clamp the output voltage.

To achieve the above objects, the MOS driver circuit according to the present invention comprises:
a pull-up NMOS transistor having its drain connected to a supply voltage, its source connected to an output terminal and its gate connected to a boosting node supplied with a boosted voltage when the output terminal is driven to a "high" state; and
a pull-down NMOS transistor having its drain connected to the output terminal and its source connected to the ground voltage, and being turned on when the output terminal is driven to a "low" state,
wherein the MOS driver circuit further comprises clamper means for clamping the boosted voltage to a predetermined voltage by opening the current path connecting the boosting node to the output node when the boosted voltage supplied to the boosting node is greater than the predetermined voltage.

Here, the predetermined voltage is set by the summation of a reference voltage, which maintains a constant value regardless of the variation of the supply voltage, and the threshold voltages of at least one MOS transistors.

BRIEF DESCRIPTION OF THE DRAWINGS

The above objects and other advantages of the present invention will become more apparent by describing the preferred embodiment of the present invention with reference to the attached drawings, in which:

FIG. 2A shows wave forms at respective stages of the conventional MOS driver at low Vcc;

FIG. 2B illustrates wave forms at respective stages of the conventional MOS driver at high Vcc;

DETAILED DESCRIPTION OF THE INVENTION

Figure 1:
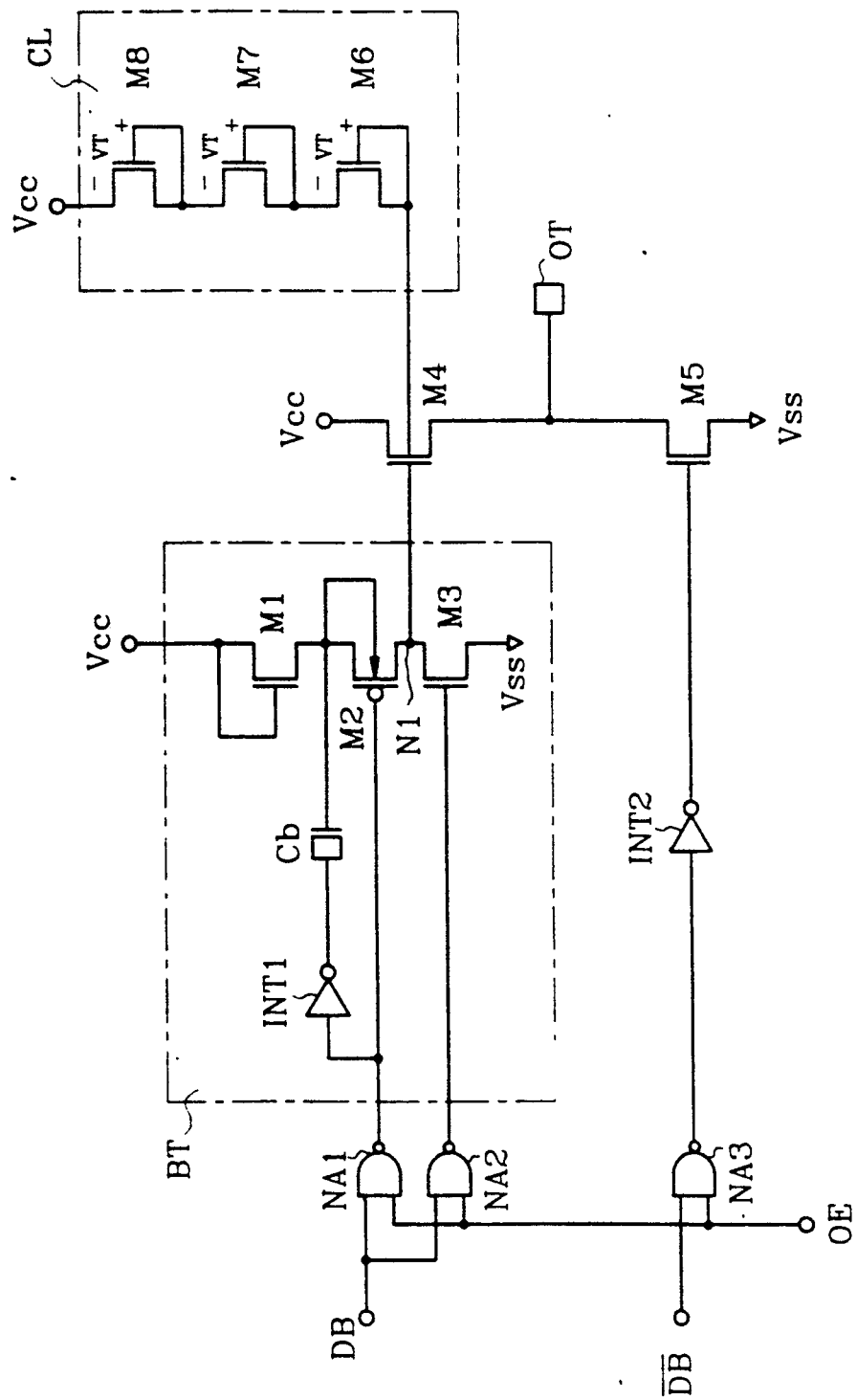
FIG. 1 is a circuit diagram of the conventional MOS driver.

First, the conventional MOS driver shown in FIG. 1 will be explained to facilitate the understanding of the present invention, prior to describing the preferred embodiment of the present invention. The MOS driver circuit shown in FIG. 1 comprises NAND gates NA1, NA2, and NA3 for gating a pair of complementary inputs DB and $\overline{DB}$ in response to an output enable signal OE, a boosting circuit BT for generating a boosted voltage in response to the outputs of the NAND gates NA1 and NA2, a push-pull output stage consisting of a pull-up NMOS transistor M4 and a pull-down NMOS transistor M5, and a clamping circuit. The pull-down NMOS transistor M5 is supplied with an output of the NAND gate NA3 via an invertor INT2.

The boosting circuit BT precharges a bootstrap capacitor Cb to the supply voltage Vcc when the output of the NAND gate NA1 is "high". At this time, the boosting node N1 connected to the gate of the pull-up NMOS transistor M4 is grounded via the NMOS transistor M3 which is turned on by the high output of the NAND gate NA2.

The clamping circuit CL comprises three NMOS transistors M6 to M8 which are connected in series between the boosting node N1 and the supply voltage Vcc. The respective gates of the NMOS transistors M6 to M8 are connected to the respective drains thereof. Accordingly, the boosted voltage supplied to the boosting node N1 is clamped to a value of a sum of the threshold voltages Vt of these NMOS transistors M6 to M8 plus the supply voltage Vcc.

The output of the conventional MOS driver circuit constituted as described above has three states, i.e. a high impedance state, a high state, and a low state. First, in the case of a high impedance state, if the output enable signal OE is a low state, the outputs of NAND gates NA1 to NA3 become high states regardless of inputs DB and $\overline{DB}$. The high output of NAND gate NA1 is inverted to a low state by an invertor INT1, and is then supplied to a terminal of the bootstrap capacitor Cb, so that the capacitor Cb is supplied with a current via a MOS transistor M1 so as to be charged with a voltage of Vcc−Vt. At this time, the PMOS transistor M2 supplied with the high output of the NAND gate NA1 is turned off and the NMOS transistor M3 supplied with a high output of NAND gate NA2 is turned on, whereby the ground voltage is supplied to the boosting node N1 and the pull-up NMOS transistor M4 is turned off. On the other hand, the high output of the NAND gate NA3 is inverted to a low state by an invertor INT2 and supplied to the pull-down NMOS transistor M5, so that the pull-down NMOS transistor M5 is turned off. Thus, the output terminal OT maintains a high impedance state.

If the output enable signal OE becomes a high state, the output states of NAND gates NA1 to NA3 vary in response to the states of inputs DB and $\overline{DB}$. First, when an input DB is a low state and the input $\overline{DB}$ is in a high state, the NAND gates NA1 and NA2 output high states, so that, as described above, the pull-up NMOS transistor M4 is turned off. Because input $\overline{DB}$ and enable signal OE are high, the output state of NAND gate NA3 is transited to a low state and inverted to a high state via invertor INT2, thereby turning on the pull-down NMOS transistor M5. Accordingly, terminal OT is driven to ground voltage Vss.

On the other hand, when the input DB is a high state and the input $\overline{DB}$ is a low state, the NAND gates NA1 and NA2 output low states, and the NAND gate NA3 outputs a high state. The NMOS transistor M3 is turned off by the low output of NAND gate NA2. Also, by a low output of the NAND gate NA1, the PMOS transistor M2 is turned on and the output of the invertor INT1 becomes a high state, so that the charge on the capacitor Cb is supplied to a boosting node N1 via the PMOS transistor M2. As a result, the boosting node N1 is boosted to a boosted voltage of Vcc+α (here, α is determined by the size of the capacitor Cb). Thus, gate of the pull-up NMOS transistor M4 is supplied with the boosted voltage of Vcc+α and fully turned on, so that the output terminal OT is driven to full supply voltage Vcc. At this time, when the boosted voltage of Vcc+α supplied to the boosting node N1 is higher than the value of Vcc+3 Vt set by the clamping circuit CL (here, Vt is a threshold voltage of the transistors), the transistors M6 to M8 in clamping circuit CL are turned on, so that the current flows from the boosting node N1 to the supply voltage Vcc to clamp the boosting node N1 to the value of Vcc+3 Vt.

However, as shown in FIGS. 2A and 2B, in the above-mentioned conventional MOS driver circuit, the boosting node N1 is connected to the supply voltage VCC via the clamping circuit CL, so that the voltage of the boosting node N1 varies according to the variation of the supply voltage Vcc. Accordingly, the clamped voltage, i.e., Vcc +3 Vt also becomes higher at high Vcc (as shown in FIG. 2B), thereby deteriorating the clamping effect. Also, the MOS transistors M6 to M8 constituting the clamping circuit CL are operated in a linear operating region, and thus the time needed to be clamped to the value of Vcc+3 Vt is as much as tens of nsec, so that it is difficult to clamp timely the output voltage level.

Figure 3:
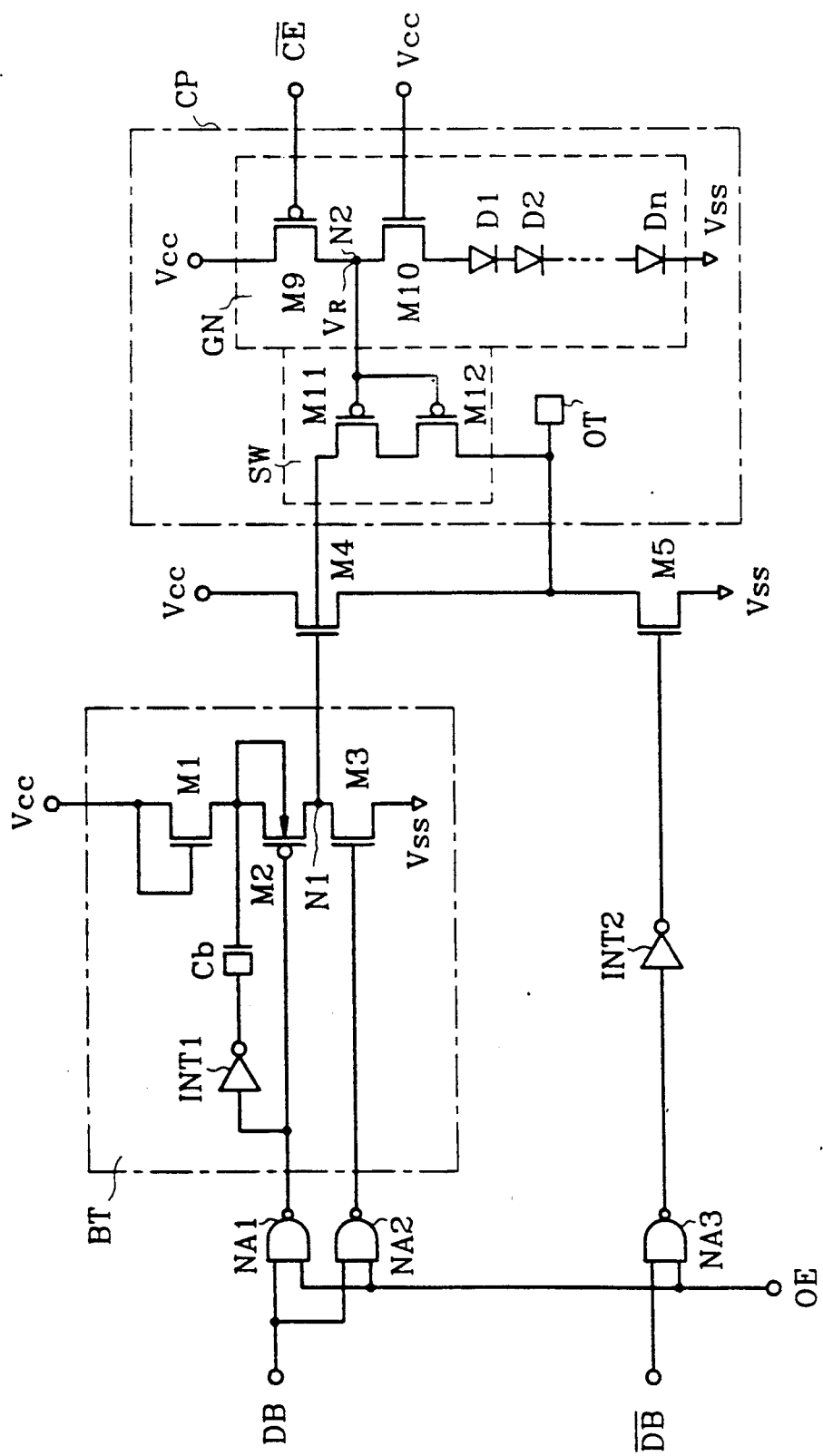
FIG. 3 is a circuit diagram of the MOS driver of the present invention.

Next, referring to FIG. 3, the MOS driver circuit according to the present invention is different from the conventional MOS driver circuit of FIG. 1 in that the clamper circuit CP is configured differently, and is connected between the boosting node N1 and the output terminal OT. Since other parts of the MOS drive circuit are unchanged, except for the above differences, like elements are denoted by the same reference numerals as FIG. 1.

In clamper circuit CP according to the present invention, when the above mentioned boosted voltage value Vcc+α supplied to the above boosting node N1 is greater than a predetermined voltage value, the current path connecting the boosting node N1 to the output terminal OT is opened to clamp the boosted voltage value to the predetermined voltage value. Here, the set voltage value remains a constant value regardless of the variation of the supply voltage Vcc.

The clamper circuit CP consists of a generating circuit GN for generating the reference voltage VR and a switch circuit SW for opening or closing the current path. The generating circuit GN comprises a PMOS transistor M9, n diodes D1 to Dn, and an NMOS transistor M10. The PMOS transistor M9 is connected between the supply voltage Vcc and the output node N2 of the reference voltage and is turned on/off in response to the enable signal $\overline{CE}$.

The diodes D1 to Dn are connected to one another in a forward direction between the reference voltage output node N2 and the ground voltage Vss to provide the reference voltage Vr. Each diode D1 to Dn has a forward voltage of VD.

The NMOS transistor M10 is turned on when the difference between the supply voltage Vcc supplied to its gate and the reference voltage VR =nVD supplied to its source is greater than its threshold voltage value Vt and is turned off if the above difference is less than its threshold voltage value Vt. In other words, if the supply voltage Vcc satisfies the inequality, Vcc>Vt+nVD, the NMOS transistor M10 is turned on, so that the value of nVD, which is the sum of the forward voltages of the diodes D1 to Dn, becomes a reference voltage VR. On the other hand, if the supply voltage Vcc satisfies the inequality Vcc<Vt+nVD, the NMOS transistor M10 is turned off, so that the voltage of Vcc is generated as the reference voltage VR. Thus, at a high Vcc, the constant value of nVD is generated as the reference voltage regardless of the voltage of Vcc.

The switch circuit SW consists of a first PMOS transistor M11 and a second PMOS transistor M12. In the first PMOS transistor M11, the source is connected to the boosting node N1, the gate is supplied with the reference voltage VR, and the drain is connected to the source of the second PMOS transistor M12. In the second PMOS transistor M12, the gate is supplied with the above reference voltage VR, and the drain is connected to the output terminal OT. Accordingly, these PMOS transistors M11 and M12 are respectively turned on when the difference between the potentials supplied to the source and to the gate is above the threshold voltage Vt, and are turned off when the difference is less than the threshold voltage.

Figure 4A:
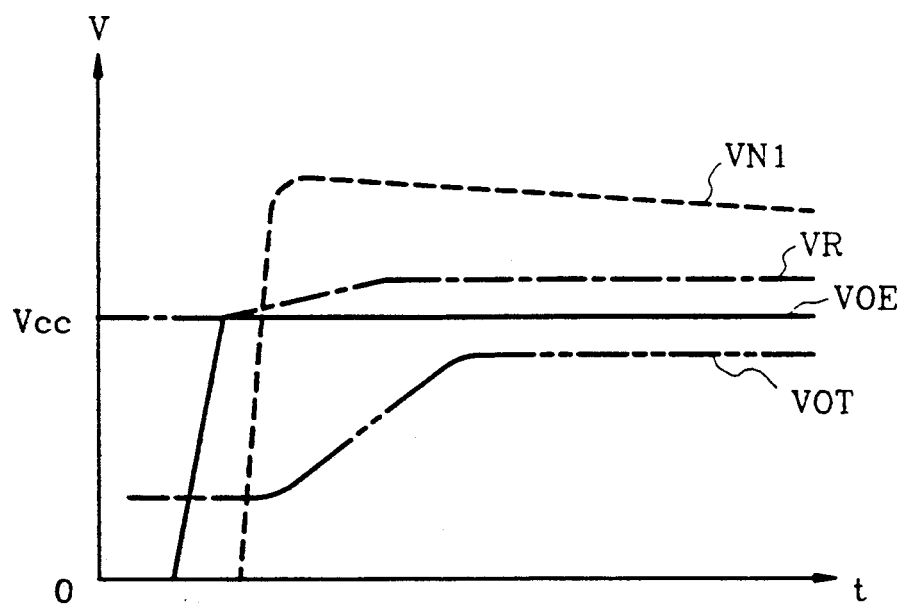
FIG. 4A illustrates wave forms at respective stages of the MOS driver of the present invention at a low Vcc.
Figure 4B:
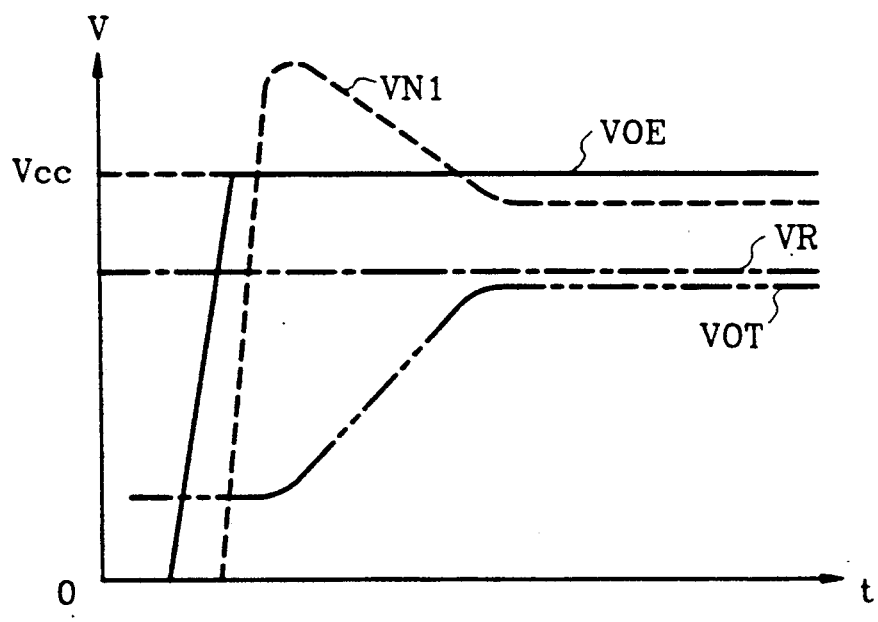
FIG. 4B shows waveforms at respective stages of the MOS driver of the present invention at a high Vcc.

Accordingly, when the boosted voltage of $Vcc+\alpha$ supplied to the boosting node N1 is greater than the value of the reference voltage VR plus the summation of the threshold voltage Vt, i.e. $Vcc+\alpha>VR+Vt$, the PMOS transistors M11 and M12 are turned on. Thus, the boosted voltage of $Vcc+\alpha$ at the boosting node N1, as shown in FIG. 4A and FIG. 4B, is clamped to the value of $VR+Vt$ which is independent of the variation of the supply voltage Vcc. Therefore, even if the supply voltage becomes a high Vcc (as shown in FIG. 4B), the potential difference supplied to the boosting node N1 is $VR+Vt$ which is a constant value, so that the voltage level of output terminal OT is clamped below a constant value.

Thus, the noise in the power and ground lines which are generated due to the variation of the output voltage caused by the variation of the supply voltage, is prevented. Also, since the clamper circuit of the present invention discharges the charge of the boosting node to the output terminal OT, more charge may be discharged rapidly during the transition of the state from a low state of the output to a high state, and as a result, more effective clamping operation can be carried out in comparison with the conventional clamping operation.

What is claimed is:

1. A MOS driver circuit comprising:
    a pull-up NMOS transistor having a drain connected to a supply voltage, a source connected to an output terminal and a gate connected to a boosting node supplied with a boosted voltage when said output terminal is driven to a "high" state;
    a pull-down NMOS transistor having a drain connected to said output terminal and a source connected to a ground voltage, and being turned on when said output terminal is driven to a "low" state; and
    clamper means for clamping said boosted voltage to a predetermined voltage by opening a current path connecting said boosting node to said output node when said boosted voltage supplied to said boosting node is greater than the predetermined voltage.

2. A MOS driver circuit of claim 1, wherein said clamper means comprises:
    generating means for generating a constant reference voltage regardless of a variation of said supply voltage; and
    switch means, connected between said boosting node and said output node which is turned on when the boosted voltage supplied to said boosting node is greater than the summation of the reference voltage of said generating means and a threshold voltage thereof.

3. The MOS driver circuit of claim 2, wherein said generating means comprises:
    a PMOS transistor connected between said supply voltage and a reference voltage output terminal and turned on in response to an enable signal;
    n diodes connected to one another in forward direction between said reference voltage output terminal and said ground voltage, for providing said reference voltage; and
    an NMOS transistor having a source to drain path connected between said reference voltage output terminal and said n diodes and a gate coupled to said supply voltage, said NMOS transistor being turned on when a difference between the supply voltage and the reference voltage is larger than a threshold voltage.

4. The MOS driver circuit of claim 2, wherein said switch means comprises:
    a first PMOS transistor having a source connected to said boosting node, a gate connected to said reference voltage and a drain; and
    a second PMOS transistor having a source connected to the drain of said first PMOS transistor, a drain connected to said output node, and a gate connected to said reference voltage.

5. The MOS driver circuit of claim 1, wherein the predetermined voltage of said clamper means is set to a summation of a normal supply voltage and a threshold voltages of at least one of said MOS transistors.

* * * * *